(12) United States Patent
Zhu

(10) Patent No.: US 9,461,382 B2
(45) Date of Patent: Oct. 4, 2016

(54) ELECTRONIC DEVICE AND FASTENING MODULE THEREOF

(71) Applicants: Inventec (Pudong) Technology Corporation, Shanghai (CN); INVENTEC CORPORATION, Taipei (TW)

(72) Inventor: Hui Zhu, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 37 days.

(21) Appl. No.: 14/693,384

(22) Filed: Apr. 22, 2015

(65) Prior Publication Data
US 2016/0165738 A1   Jun. 9, 2016

(30) Foreign Application Priority Data

Dec. 5, 2014   (CN) .......................... 2014 1 0740929

(51) Int. Cl.
| | |
|---|---|
| *H05K 7/00* | (2006.01) |
| *H01R 12/00* | (2006.01) |
| *H01R 12/70* | (2011.01) |
| *G06F 1/18* | (2006.01) |

(52) U.S. Cl.
CPC ............ *H01R 12/7076* (2013.01); *G06F 1/18* (2013.01)

(58) Field of Classification Search
None
See application file for complete search history.

(56) References Cited

U.S. PATENT DOCUMENTS

| | | | | |
|---|---|---|---|---|
| 5,176,523 A | * | 1/1993 | Lai ......................... | G06F 1/183 439/377 |
| 5,446,609 A | * | 8/1995 | Thanos ............... | G06F 13/4081 360/98.03 |
| 5,495,389 A | * | 2/1996 | Dewitt ..................... | G06F 1/18 220/255 |
| 5,574,625 A | * | 11/1996 | Ohgami ................ | G06F 1/1626 312/223.2 |
| 5,833,478 A | * | 11/1998 | Tseng ..................... | H01R 12/83 439/326 |
| 6,115,258 A | * | 9/2000 | Hoyle, Jr. ............ | H05K 7/1409 211/41.17 |
| 6,128,196 A | * | 10/2000 | Hoyle, Jr. ............ | H05K 7/1439 206/454 |
| 6,142,801 A | * | 11/2000 | Koseki ................. | H01R 13/633 439/159 |
| 6,404,625 B1 | * | 6/2002 | Chen ...................... | G06F 1/187 312/223.1 |

(Continued)

*Primary Examiner* — Courtney Smith
*Assistant Examiner* — Rashen E Morrison
(74) *Attorney, Agent, or Firm* — Maschoff Brennan

(57) ABSTRACT

An electronic device includes a case, a mother board, a fixing component, a fastening module and an interface card. The fastening module comprises a circuit board, a first connector, a second connector and a fastening component. The circuit board is fixed to the fixing component. The circuit board has a sliding groove. The first connector is fixed to a top surface of the circuit board. The second connector is fixed to a bottom surface of the circuit board. The fastening component includes a sliding portion, a first fastening portion and a second fastening portion. The first and second fastening portions are fixed to the sliding portion. The sliding portion is slidably disposed in the sliding groove to adjust a distance between the first fastening portion and the first connector and a distance between the second fastening portion and the second connector.

12 Claims, 10 Drawing Sheets

(56) References Cited

U.S. PATENT DOCUMENTS

| | | | | |
|---|---|---|---|---|
| 6,711,015 B2* | 3/2004 | Syring | H01L 23/467 | |
| | | | 165/80.3 | |
| 7,184,261 B2* | 2/2007 | Chung | G06F 1/181 | |
| | | | 361/679.56 | |
| 7,280,345 B2* | 10/2007 | Park | G06F 1/181 | |
| | | | 361/679.01 | |
| 7,365,969 B2* | 4/2008 | Chung | G11B 33/128 | |
| | | | 361/679.55 | |
| 7,494,195 B2* | 2/2009 | Han | H02G 3/081 | |
| | | | 312/223.2 | |
| 8,837,137 B2* | 9/2014 | Yin | H05K 7/1489 | |
| | | | 248/309.1 | |
| 2005/0183100 A1* | 8/2005 | Chung | G11B 33/128 | |
| | | | 720/600 | |
| 2006/0273173 A1* | 12/2006 | Ho | G06K 7/0021 | |
| | | | 235/441 | |
| 2010/0103593 A1* | 4/2010 | Chang | H04M 1/0274 | |
| | | | 361/679.01 | |
| 2012/0033388 A1* | 2/2012 | Peng | G06F 1/185 | |
| | | | 361/737 | |
| 2012/0229996 A1* | 9/2012 | Ko | G06F 1/1633 | |
| | | | 361/752 | |
| 2012/0327578 A1* | 12/2012 | Lu | G06F 1/185 | |
| | | | 361/679.4 | |
| 2013/0164953 A1* | 6/2013 | Sun | H01R 12/73 | |
| | | | 439/65 | |
| 2013/0170161 A1* | 7/2013 | Sun | H01R 13/639 | |
| | | | 361/759 | |
| 2013/0301209 A1* | 11/2013 | Zhou | G06F 1/186 | |
| | | | 361/679.32 | |
| 2013/0336715 A1* | 12/2013 | Li | H05K 5/0217 | |
| | | | 403/330 | |
| 2015/0207249 A1* | 7/2015 | Huang | H01R 12/716 | |
| | | | 439/347 | |
| 2016/0190715 A1* | 6/2016 | Liu | H01R 12/7011 | |
| | | | 439/325 | |

* cited by examiner

ELECTRONIC DEVICE AND FASTENING MODULE THEREOF

CROSS-REFERENCE TO RELATED APPLICATIONS

This non-provisional application claims priority under 35 U.S.C. §119(a) on Patent Application No(s). 201410740929.8 filed in China on Dec. 5, 2014, the entire contents of which are hereby incorporated by reference.

BACKGROUND OF THE INVENTION

1. Technical Field of the Invention

The disclosure relates to an electronic device, more particular to an electronic device having a fastening module for fastening an interface card.

2. Description of the Related Art

A Computer or a server includes a central processing unit (CPU), a memory and an input/output (I/O) device that are assembled together, and these components are connected to each other via buses.

Generally, an interface card (or named sub-circuit board) is screwed or riveted to a mother board of the computer/server to avoid the interface card separating from the mother board. However, it is difficult to detach the interface card from the mother board so that it is unfavorable for repairing the computer/server.

Moreover, with the development of technology, the computer/server becomes compact, and the number of the components located in the computer/server increases gradually. Therefore, there is no enough space for accommodating the components in the computer/server is reduced so that a gap between any two adjacent components is decreased, and therefore it is difficult to attach and detach the interface card to the computer/server.

SUMMARY OF THE INVENTION

According to one aspect of the disclosure, an electronic device comprises a case, a mother board, at least one fixing component, a fastening module and at least one interface card. The mother board is disposed on the case. The fixing component is fixed to the mother board. The fastening module comprises a circuit board, a first connector, a second connector and a fastening component. The circuit board is electrically connected to the mother board. The circuit board and the mother board are fixed to two both ends of the fixing component, respectively. The circuit board has a sliding groove, a top surface and a bottom surface. The top surface and the bottom surface are opposite to each other. The sliding groove extends through the top surface and the bottom surface of the circuit board. The first connector is fixed to the top surface of the circuit board. The second connector is fixed to the bottom surface of the circuit board. The fastening component comprises a sliding portion, a first fastening portion and a second fastening portion. The first fastening portion and the second fastening portion are fixed to two both sides of the sliding portion, respectively. The first fastening portion corresponds to the first connector. The second fastening portion corresponds to the second connector. The sliding portion is slidably disposed in the sliding groove so as to adjust a distance between the first fastening portion and the first connector and a distance between the second fastening portion and the second connector. The interface card has a first end and a second end that are opposite to each other. The first end is selectively inserted into the first connector or the second connector, and the second end is selectively fastened to the first fastening portion or the second fastening portion so that the interface card is interposed between the first connector and the first fastening portion or between the second connector and the second fastening portion.

According to another aspect of the disclosure, a fastening module is for fastening at least one interface card having a first end and a second end that are opposite to each other. The fastening module comprises a circuit board, a first connector, a second connector and a fastening component. The circuit board has a sliding groove, a top surface and a bottom surface. The top surface and the bottom surface are opposite to each other. The sliding groove extends through the top surface and the bottom surface of the circuit board. The first connector is fixed to the top surface of the circuit board. The second connector is fixed to the bottom surface of the circuit board. The fastening component comprises a sliding portion, a first fastening portion and a second fastening portion. The first fastening portion and the second fastening portion are fixed to two both sides of the sliding portion, respectively. The first fastening portion corresponds to the first connector. The second fastening portion corresponds to the second connector. The sliding portion is slidably disposed in the sliding groove so as to adjust a distance between the first fastening portion and the first connector and a distance between the second fastening portion and the second connector. The first end of the interface card is selectively inserted into the first connector or the second connector, and the second end is selectively fastened to the first fastening portion or the second fastening portion so that the at least one interface card is interposed between the first connector and the first fastening portion or between the second connector and the second fastening portion.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

Figure 1:
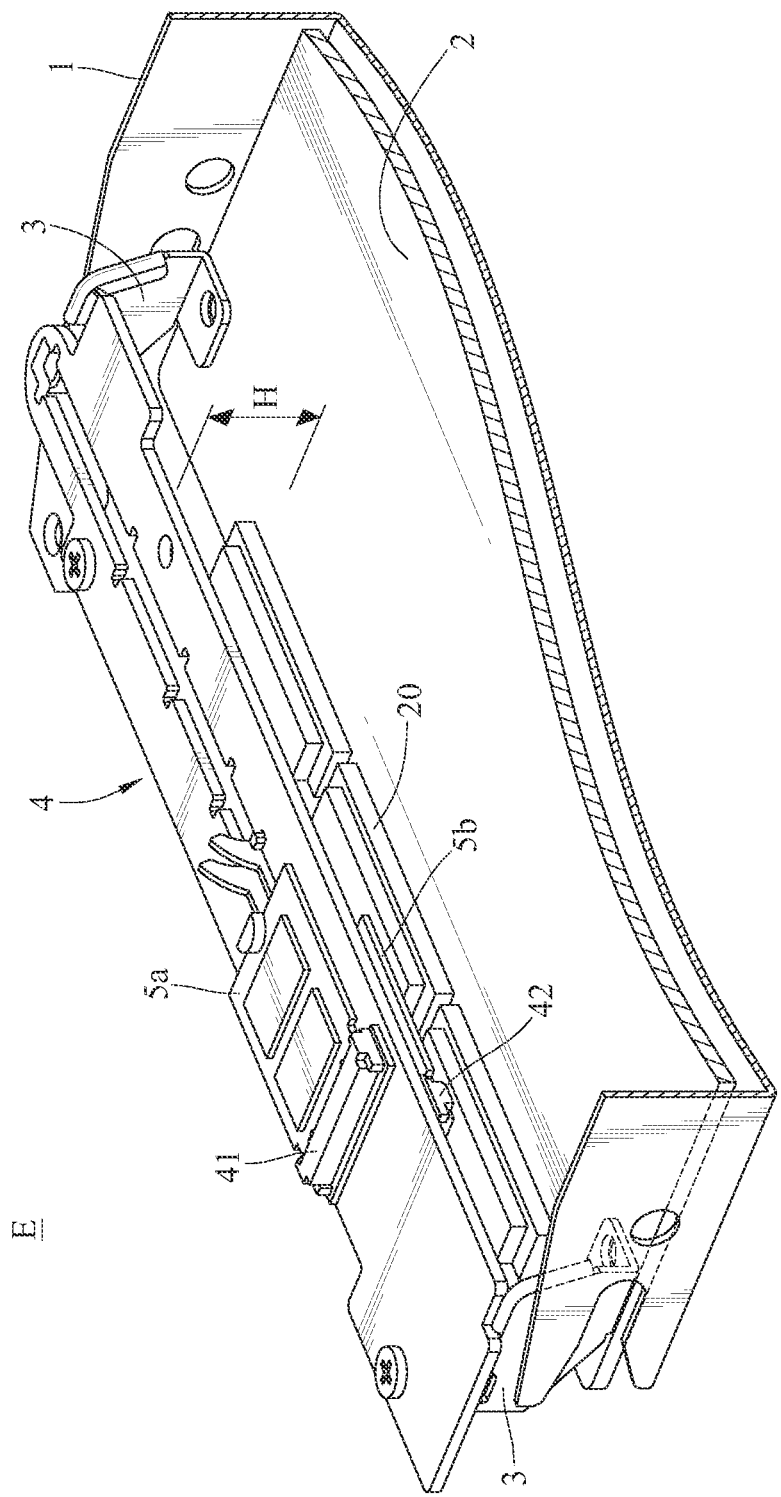
FIG. 1 is a partial perspective view of an electronic device according to a first embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
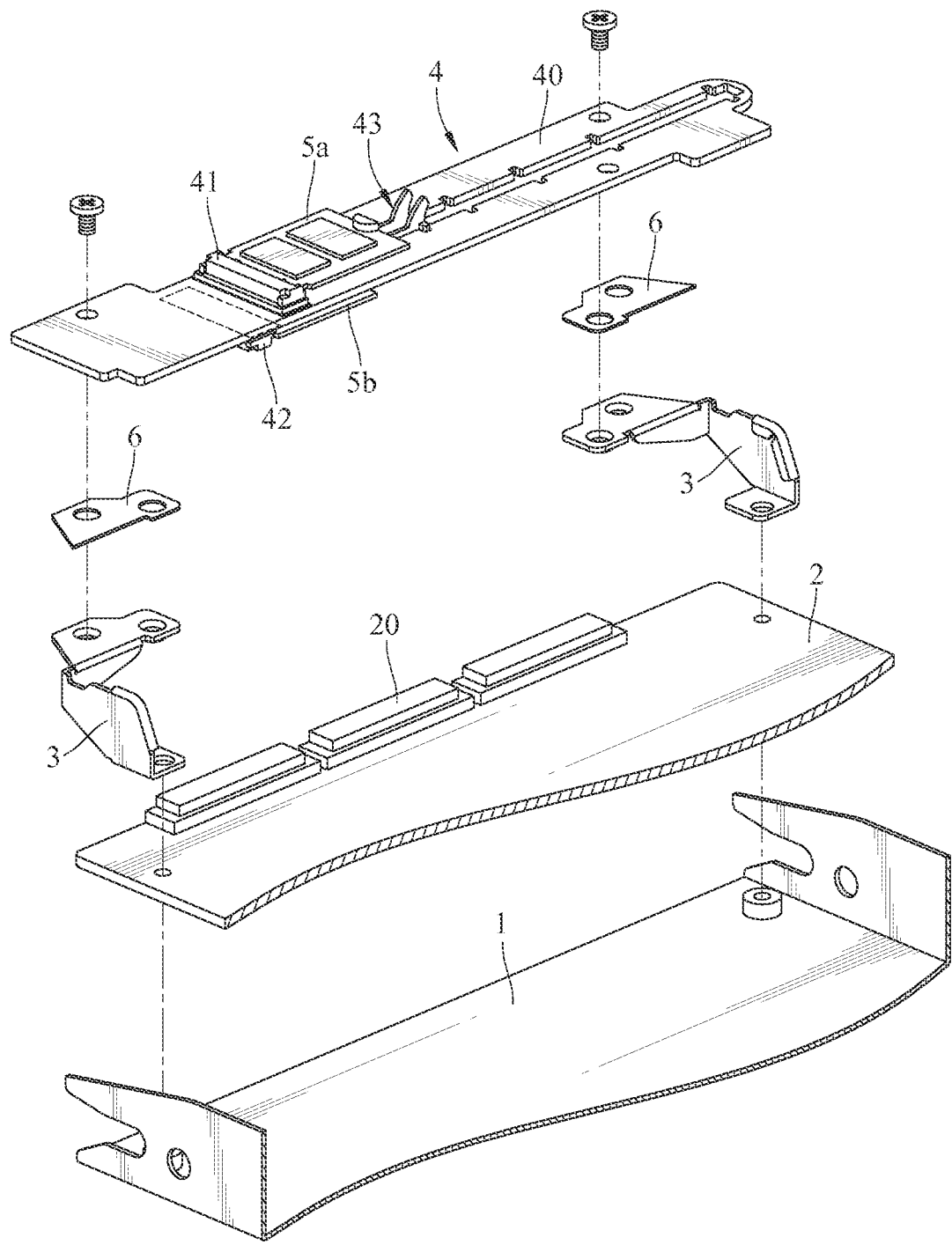
FIG. 2 is an exploded view of the electronic device in FIG. 1.

Please refer to FIG. 1 and FIG. 2. FIG. 1 is a partial perspective view of an electronic device according to a first embodiment. FIG. 2 is an exploded view of the electronic device in FIG. 1. In this embodiment, an electronic device E comprises a case 1, a mother board 2, two fixing components 3, a fastening module 4 and two interface cards 5a, 5b.

For example, the case 1 is a computer case or a server case. The mother board 2 is disposed on the case 1.

For example, the fixing component 3 is a metal bracket. The two fixing components 3 are both fixed to the mother board 2. In this embodiment, the number of the fixing components 3 is two, but the disclosure is not limited thereto. In other embodiments, the number of the fixing components 3 can be one or more than two.

The both ends of the fastening module 4 are fixed to the two fixing component 3, respectively. In this embodiment, the fastening module 4 comprises a circuit board 40, a first connector 41, a second connector 42 and a fastening component 43. The following describes the configuration of the fastening module 4.

Figure 3:
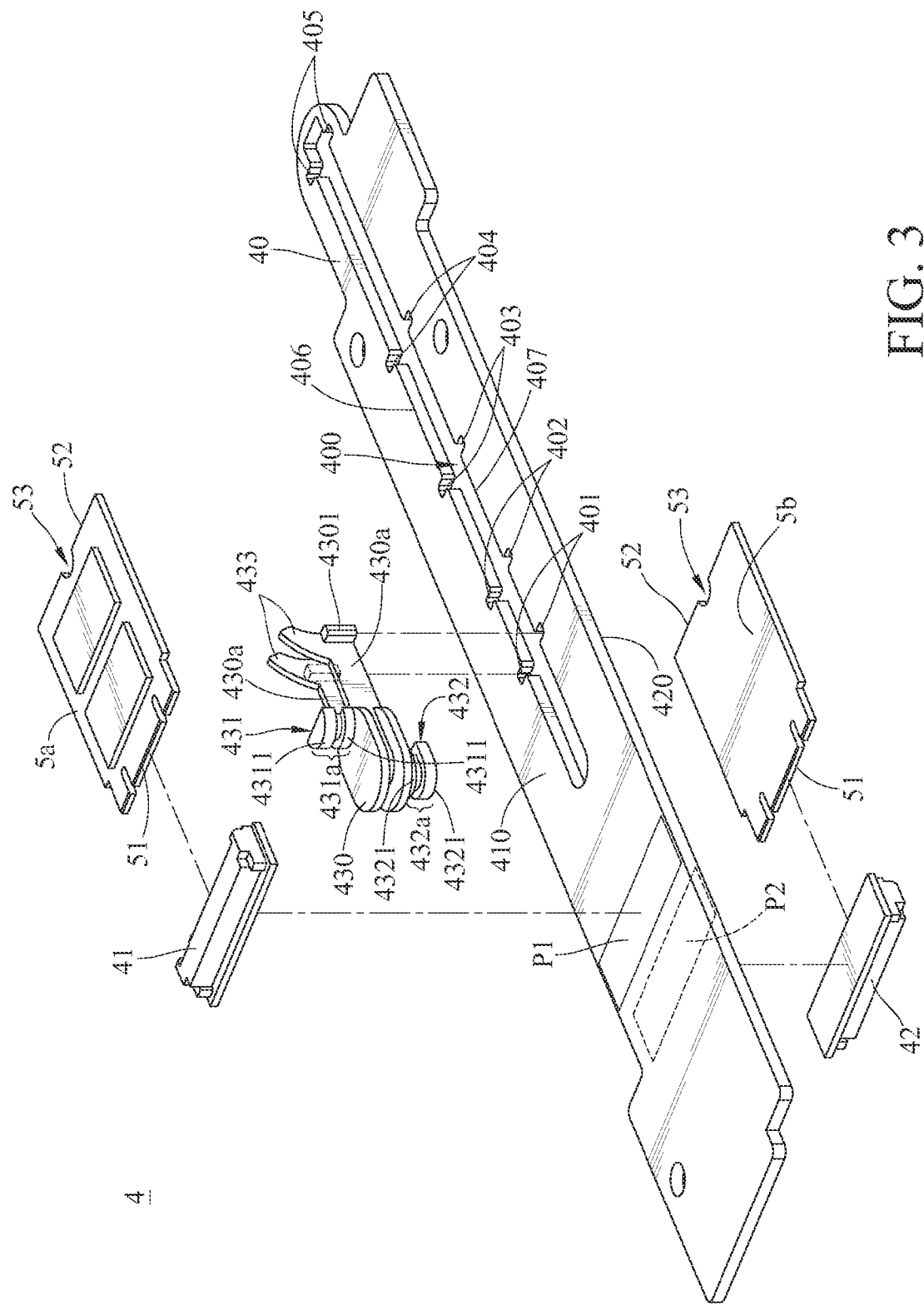
FIG. 3 is a perspective view of a fastening module according to the first embodiment.
Figure 4:
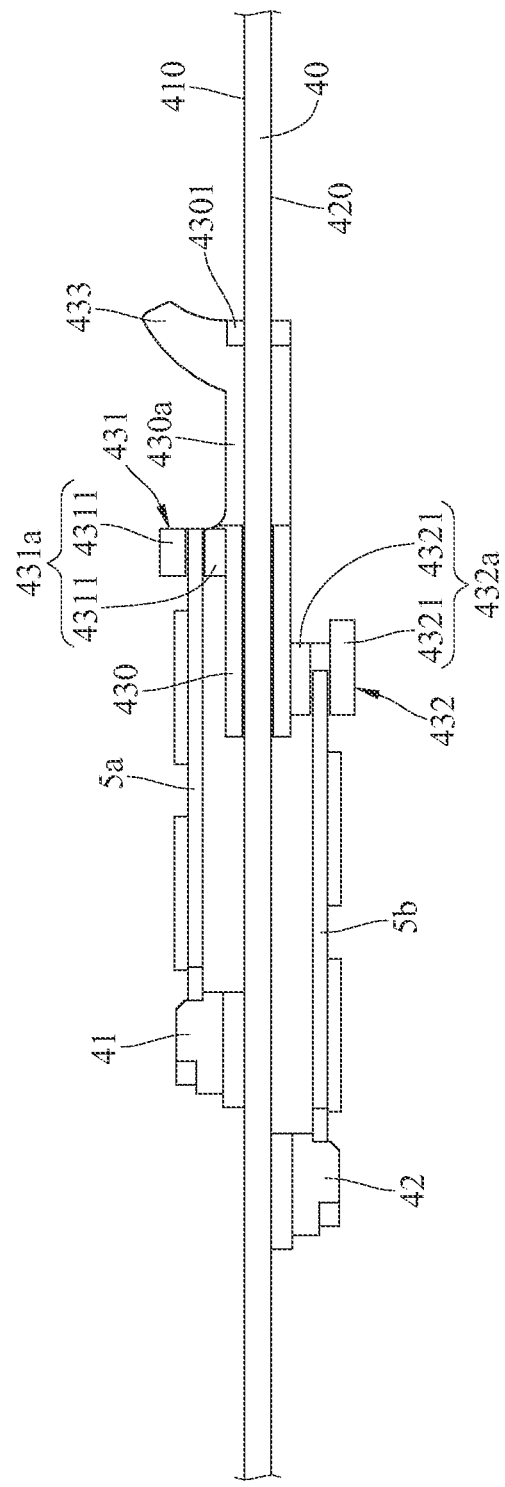
FIG. 4 is a side view of the fastening module according to the first embodiment.
Figure 5:
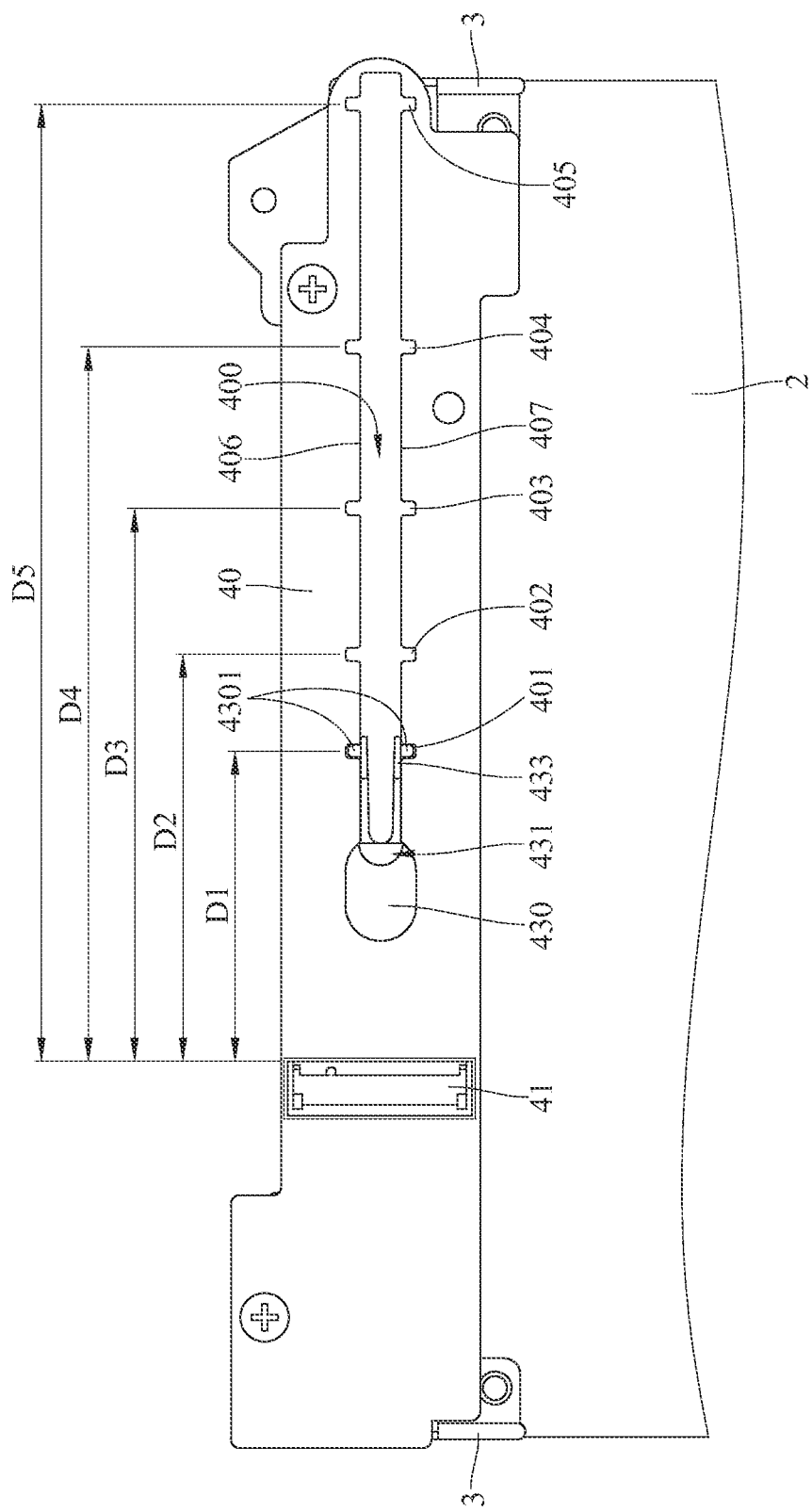
FIG. 5 is a top view of the fastening module according to the first embodiment.

Please refer to FIG. 3 to FIG. 5. FIG. 3 is a perspective view of a fastening module according to the first embodiment. FIG. 4 is a side view of the fastening module according to the first embodiment. FIG. 5 is a top view of the fastening module according to the first embodiment.

The both ends of the circuit board 40 are fixed to the two fixing component 3, respectively. The circuit board 40 is electrically connected to the mother board 2. For example, the circuit board 40 is electrically connected to the mother board 2 via a signal transmitting port (not shown in the drawings). The circuit board 40 has a sliding groove 400, a top surface 410 and a bottom surface 420. The top surface 410 and the bottom surface 420 are located at the both sides of the circuit board 40. The sliding groove 400 extends through the top surface 410 and the bottom surface 420 of the circuit board 40.

The sliding groove 400 of the circuit board 40 has two first limiting notches 401, two second limiting notches 402, two third limiting notches 403, two fourth limiting notches 404 and two fifth limiting notches 405. In this embodiment, the sliding groove 400 of the circuit board 40 further has a first side edge 406 and a second side edge 407. The two first limiting notches 401 are located at the first side edge 406 and the second side edge 407, respectively, and the two first limiting notches 401 face to each other. The two second limiting notches 402 are located at the first side edge 406 and the second side edge 407, respectively, and the two second limiting notches 402 face to each other. The two third limiting notches 403 are located at the first side edge 406 and the second side edge 407, respectively, and the two third limiting notches 403 face to each other. The two fourth limiting notches 404 are located at the first side edge 406 and the second side edge 407, respectively, and the two fourth limiting notches 404 face to each other. The two fifth limiting notches 405 are located at the first side edge 406 and the second side edge 407, respectively, and the two fifth limiting notches 405 face to each other.

The disclosure is not limited to the above-mentioned numbers of the limiting notches 401-405 and the above-mentioned positions of the limiting notches 401-405. In some other embodiments, the circuit board 40 can only have two first limiting notches 401 and two second limiting notches 402. Moreover, in some other embodiments, the circuit board 40 can have only one first limiting notch 401, only one second limiting notch 402, only one third limiting notch 403, only one fourth limiting notch 404 and only one fifth limiting notch 405, and the first limiting notch 401 through the fifth limiting notch 405 can be located at the first side edge 406 or the second side edge 407.

The first connector 41 is fixed to the top surface 410 of the circuit board 40, and the second connector 42 is fixed to the bottom surface 420 of the circuit board 40. As shown in FIG. 5, there is a distance D1 between the first limiting notch 401 and the first connector 41. There is a distance D2 between the second limiting notch 402 and the first connector 41. There is a distance D3 between the third limiting notch 403 and the first connector 41. There is a distance D4 between the fourth limiting notch 404 and the first connector 41. There is a distance D5 between the fifth limiting notch 405 and the first connector 41. The distance D1 is less than the distance D2. The distance D2 is less than the distance D3. The distance D3 is less than the distance D4. The distance D4 is less than the distance D5. Therefore, the fastening module 4 is for fastening interface cards of different lengths. In this embodiment, a length of the interface card means the measured dimension of the interface card. That is, a distance of the both ends of the interface card. For example, in this embodiment, a length of the interface card 5a in FIG. 3 is a distance between a first end 51 and a second end 52 of the interface card 5a.

The fastening component 43 comprises a sliding portion 430, a first fastening portion 431, a second fastening portion 432 and two pressing portions 433. The sliding portion 431 is slidably disposed in the sliding groove 400 of the circuit board 40 for sliding relative to the circuit board 40 towards or away from the first connector 41 and the second connector 42. Therefore, the sliding portion 431 is for adjusting a distance between the first fastening portion 431 and the first connector 41 and a distance between the second fastening portion 432 and the second connector 42. The sliding portion 430 comprises two extending parts 430a extending along the first side edge 406 and the second side edge 407 of the sliding groove 400, respectively. The two extending parts 430a each comprise a limiting block 4301 matching with the first limiting notches 401 through the fifth limiting notches 405 (namely, the limiting notches 401-405). Therefore, the limiting block 4301 is selectively fastened to the first limiting notches 401 through the fifth limiting notches 405 so that the sliding portion 430 is fixed to the circuit board 40.

The first fastening portion 431 and the second fastening portion 432 are fixed to both sides of the sliding portion 430, respectively. The first fastening portion 431 corresponds to the first connector 41, and the second fastening portion 432 corresponds to the second connector 42. The first fastening portion 431 protrudes out of the top surface 410 of the circuit board 40 from the sliding portion 430, and the second fastening portion 432 protrudes out of the bottom surface 420 from the sliding portion 430. The first fastening portion 431 comprises a fastening section 431a, and the second fastening portion 432 comprises a fastening section 432a.

The fastening section 431a comprises two protrusions 4311 separated by a distance, and the fastening section 432a comprises two protrusions 4321 separated by a distance. However, the disclosure is not limited to the number of the protrusions 4311 and that of the protrusions 4321. In other embodiments, the fastening section 431a comprises a plurality of protrusions 4311, and the fastening section 432a comprises a plurality of protrusions 4321.

The two pressing portions 433 are fixed on the two extending parts 430a of the sliding portion 430, respectively. When each of the two pressing portions 433 is for being pressed by an external force, two extending parts 430a get closer to each other, thereby the limiting block 4301 are separated from the first limiting notch 401, the second limiting notch 402, the third limiting notch 403, the fourth limiting notch 404 or the fifth limiting notch 405. Therefore, the sliding portion 430 is for sliding relative to the circuit board 40 to adjust the distance between the first fastening portion 431 and the first connector 41 and the distance between the second fastening portion 432 and the second connector 42.

The two interface cards 5a, 5b are, for example, two solid-state drives, two wireless network cards or two display cards. The two interface cards 5a, 5b each have a first end 51, a second end 52 and an indentation 53. The first end 51 and the second end 52 are opposite to each other, and the indentation 53 is located at the second end 52. The indentation 53 of the interface card 5a is interposed between the two protrusions 4311 so as to fasten the second end 52 of the interface card 5a to the first fastening portion 431. The first end 51 of the interface card 5a is inserted into the first connector 41. Therefore, the interface card 5a is interposed between the first connector 41 and the first fastening portion 431, and the interface card 5a is electrically connected to the circuit board 40 via the first connector 41.

The indentation 53 of the interface card 5b is interposed between the two protrusions 4321 so as to fasten the second end 52 of the interface card 5b to the second fastening portion 432. The first end 51 of the interface card 5b is inserted into the second connector 42. Therefore, the interface card 5b is interposed between the second connector 42 and the second fastening portion 432, and the interface card 5b is electrically connected to the circuit board 40 via the second connector 42.

Furthermore, the electronic device E further comprises two electrical insulators 6. The electrical insulator 6 is interposed between the fixing component 3 and the circuit board 40 of the fastening module 4 so as to connect the fixing component 3 to the circuit board 40. The electrical insulator 6 is, for example, a rubber gasket.

Moreover, a first projecting zone P1 is defined by orthogonally projecting the first connector 41 on the top surface 410 of the circuit board 40, and a second projecting zone P2 is defined by orthogonally projecting the second connector 42 on the bottom surface 420 of the circuit board 40. In this embodiment, the first projecting zone P1 is not overlapped with the second projecting zone P2. Therefore, it is favorable for routing a layout of the circuit board 40.

In addition, the circuit board 40 of the fastening module 4 is fixed to the fixing component 3 so that the circuit board 40 is located above the mother board 2. There is a gap H between the circuit board 40 and the mother board 2, and the gap H is greater or equal to a thickness of the interface card 5b. The mother board 2 can comprise at least one slot 20 on which an electronic component (not shown in the drawings) can be disposed. The fastening module 4 is fixed to the mother board 2 via the fixing component 3 so as to cover the slot 20.

Figure 6A:
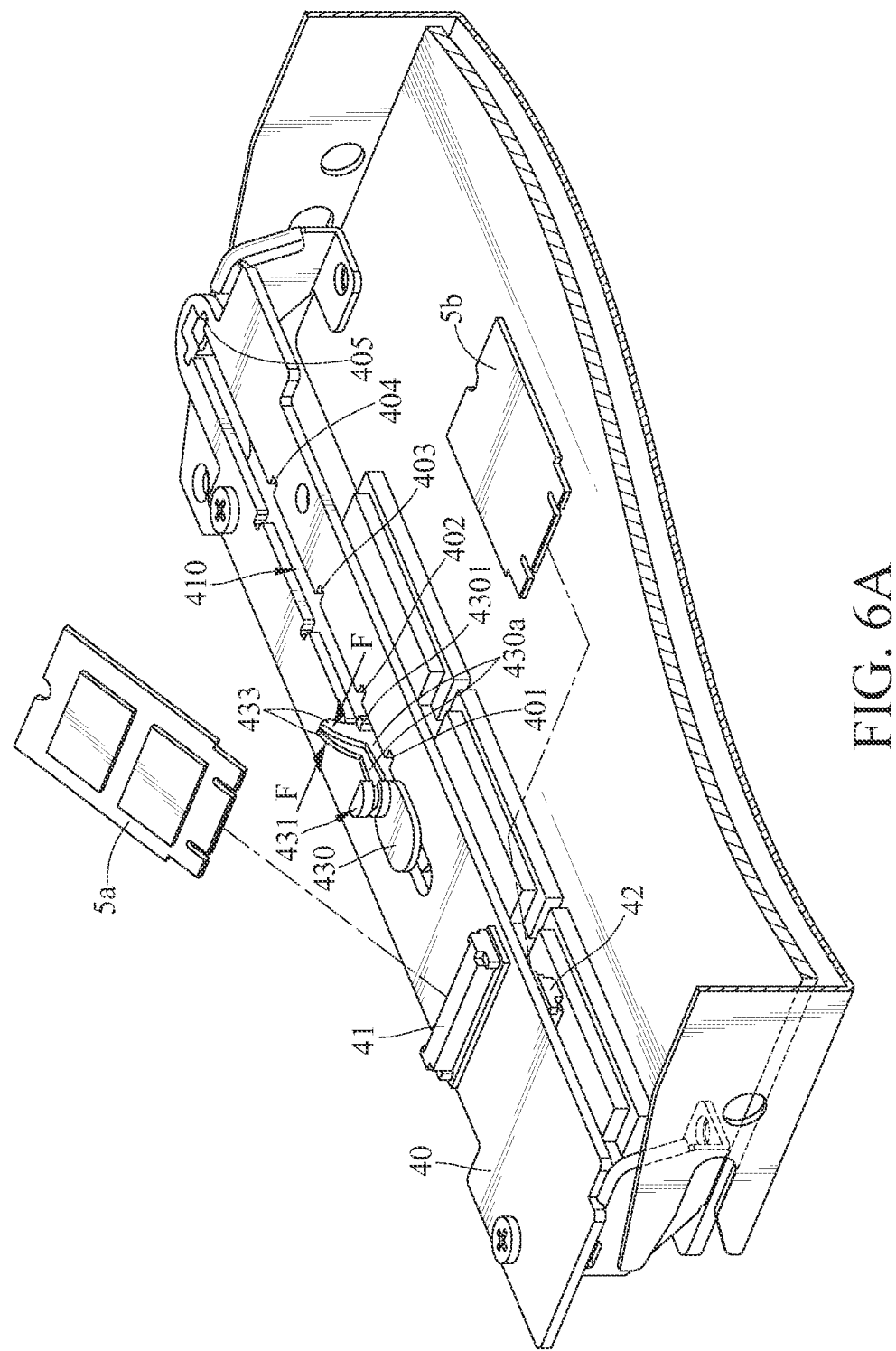
FIG. 6A is a perspective view of the electronic device with interface cards being detached from the fastening module according to the first embodiment.
Figure 6B:
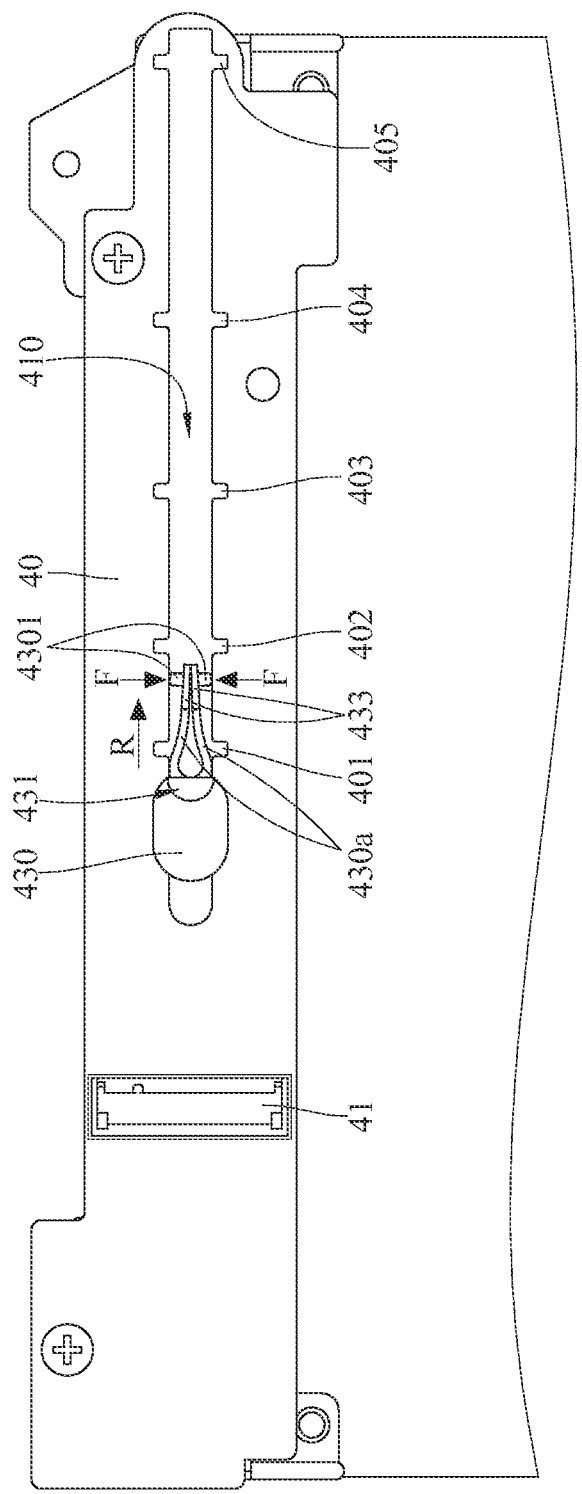
FIG. 6B is a top view of the fastening module in FIG. 6A with the interface cards being detached.

The following describes method of detaching the interface cards. Please refer to FIG. 6A and FIG. 6B. FIG. 6A is a perspective view of the electronic device with interface cards being detached from the fastening module according to the first embodiment. FIG. 6B is a top view of the fastening module in FIG. 6A with the interface cards being detached.

Please refer to FIG. 1 to FIG. 3 again. In this embodiment, the limiting block 4301 of the sliding portion 430 is initially fastened to the first limiting notch 401. The interface card 5a is interposed between the first connector 41 and the first fastening portion 431, and the interface card 5b is interposed between the second connector 42 and the second fastening portion 432.

As seen in FIG. 6B, when a user tries to detach the interface cards 5a, 5b, an external force F is applied on each of the two pressing portions 433 so as to drive the two extending parts 430a to be closer to each other, thereby the two limiting blocks 4301 are separated from the two first limiting notches 401, respectively.

Next, the sliding portion 430 is driven to slide relative to the circuit board 40 in the sliding groove 410 along a direction R so as to adjust the distance between the first connector 41 and the first fastening portion 431, thereby the user is able to detach the interface card 5a. When the sliding portion 430 is driven to slide along the direction R,t the distance between the second connector 42 and the second fastening portion 432 is also adjusted, thereby the user is able to detach the interface card 5b.

Figure 7A:
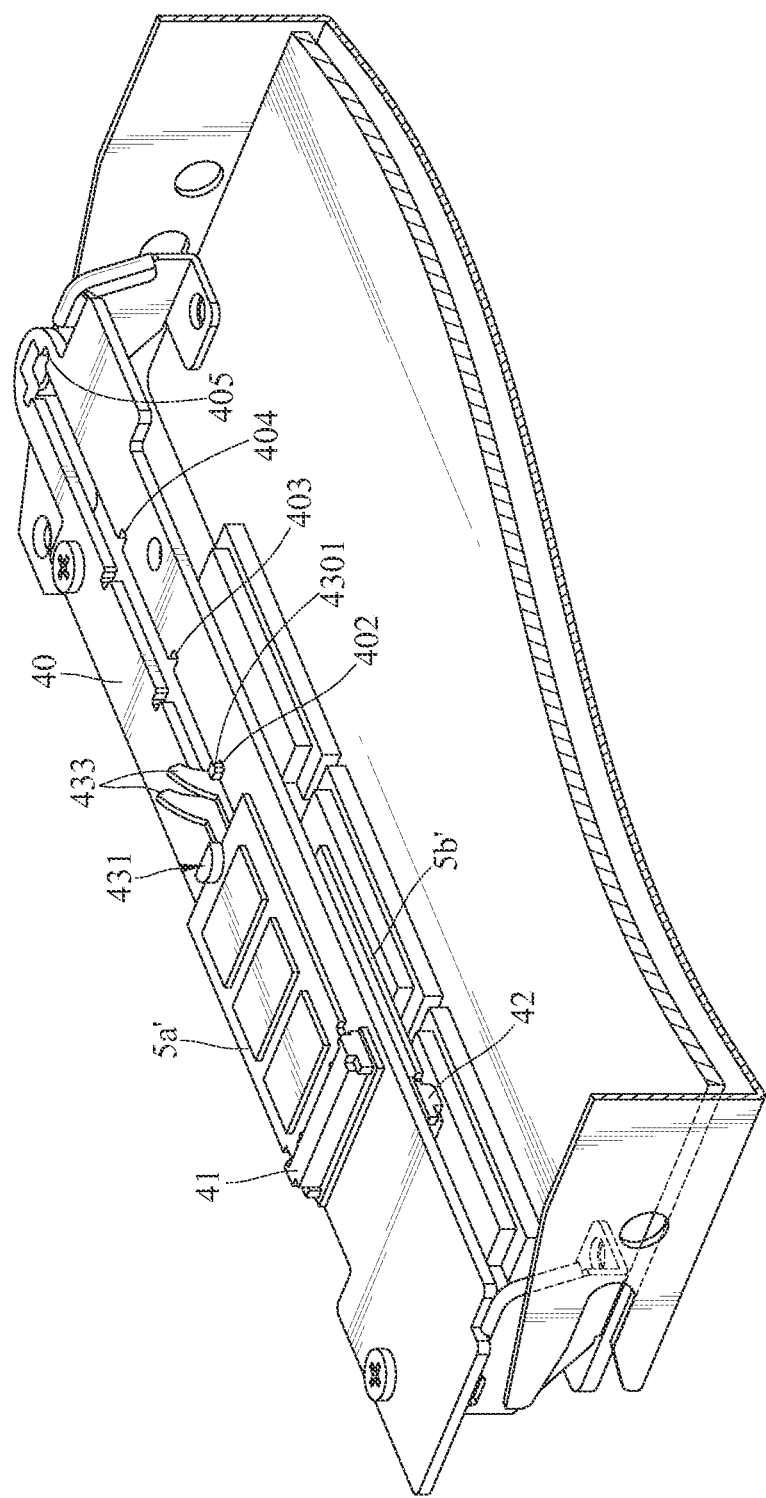
FIG. 7A is a partial perspective view of the electronic device with another interface card being fastened to the fastening module according to the first embodiment.
Figure 7B:
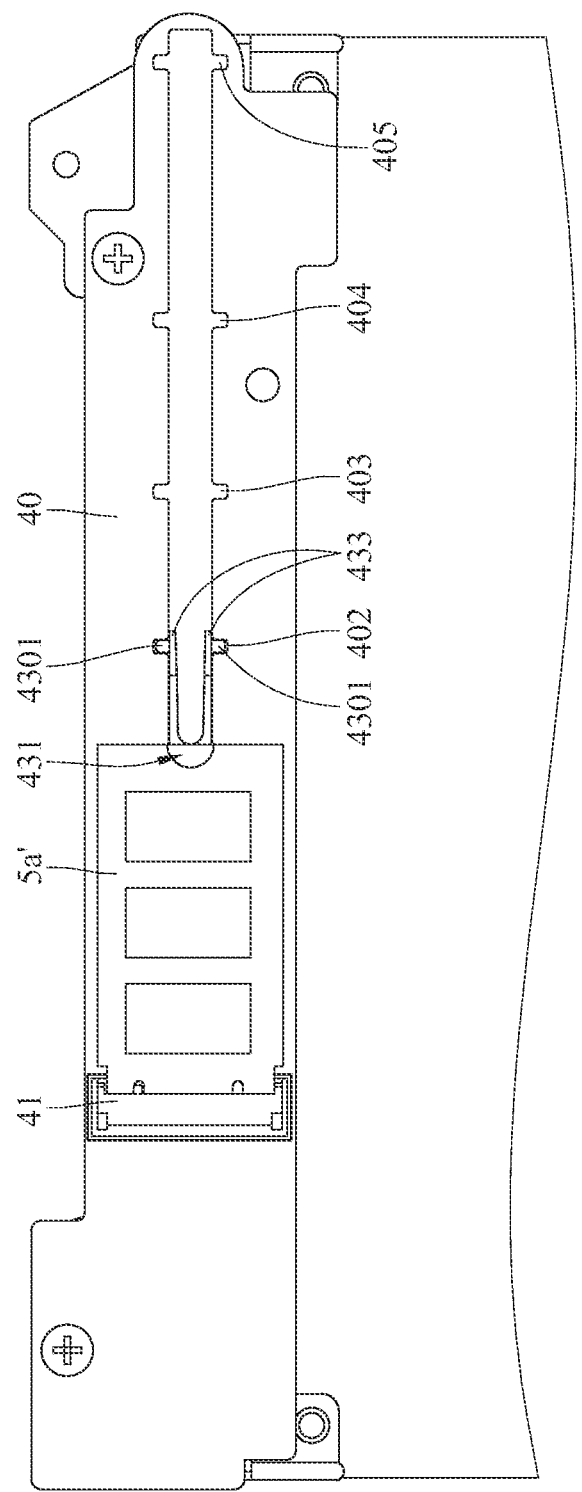
FIG. 7B is a top view of the fastening module in FIG. 7A.

The following describes method of fastening the interface cards. Please refer to FIG. 7A and FIG. 7B. FIG. 7A is a partial perspective view of the electronic device with another interface card being fastened to the fastening module according to the first embodiment. FIG. 7B is a top view of the fastening module in FIG. 7A.

When the user tries to replace the interface cards 5a, 5b with two interface cards 5a', 5b' whose lengths are greater than the interface cards 5a, 5b, the interface cards 5a, 5b are detached by aforementioned method.

Next, the sliding portion 430 is driven to slide relative to the circuit board 40 in the sliding groove 410 so as to adjust the distance between the first connector 41 and the first fastening portion 431, thereby the user is able to insert the expansion 5a' into the first connector 41. The sliding portion 430 is driven to slide so as to adjust the distance between the second connector 42 and the second fastening portion 432, thereby the user is able to insert the expansion 5b' into the second connector 42.

Next, the sliding portion 430 is driven to slide relative to the circuit board 40 so as to position the limiting block 4301 of the sliding portion 430 to align with the second limiting notch 402.

Next, the external force F is released from the pressing part 433 so that the two limiting blocks 4301 are fastened to the two second limiting notches 402, respectively, thereby the sliding portion 430 is fastened to the circuit board 40. When the sliding portion 430 is fastened to the circuit board 40, the interface card 5a' is interposed between the first connector 41 and the first fastening portion 431 (That is, an end of the interface card 5a' is inserted into the first connector 41, and the other end of the interface card 5a' is fastened to the fastening portion 431), and the interface card 5b' is interposed between the second connector 42 and the second fastening portion 432 (That is, an end of the interface card 5b' is inserted into the second connector 42, and the other end of the interface card 5b' is fastened to the second fastening portion 432).

According to the embodiment of the disclosure, the sliding portion 430 of the fastening component 43 is slidably disposed in the sliding groove 400 for sliding relative to the circuit board 40. Therefore, the sliding portion 430 is for adjusting a distance between the first fastening portion 431 and the first connector 41 and a distance between the second fastening portion 432 and the second connector 42. Therefore, the user is able to conveniently fasten and replace the interface cards having different lengths by adjusting a position of the sliding portion 430 in the sliding groove 400, thereby it is favorable for disposing more interface cards in a limited amount of space of the electronic device E.

Furthermore, the sliding groove 400 of the circuit board 40 comprises two first limiting notches 401, two second limiting notches 402, two third limiting notches 403, two fourth limiting notches 404 and two fifth limiting notches 405. Therefore, the fastening module 4 is for fasten both of the interface cards 5a and 5b/5a' and, 5b' when the limiting block 4301 is fastened to the first limiting notch 401/the second limiting notch 402. In this embodiment, the limiting block 4301 also can be fastened to the third limiting notch 403, the fourth limiting notch 404 or the fifth limiting notch 405 so that the fastening module 4 is for fastening the expansion cards of the other three sizes of lengths.

Figure 8:
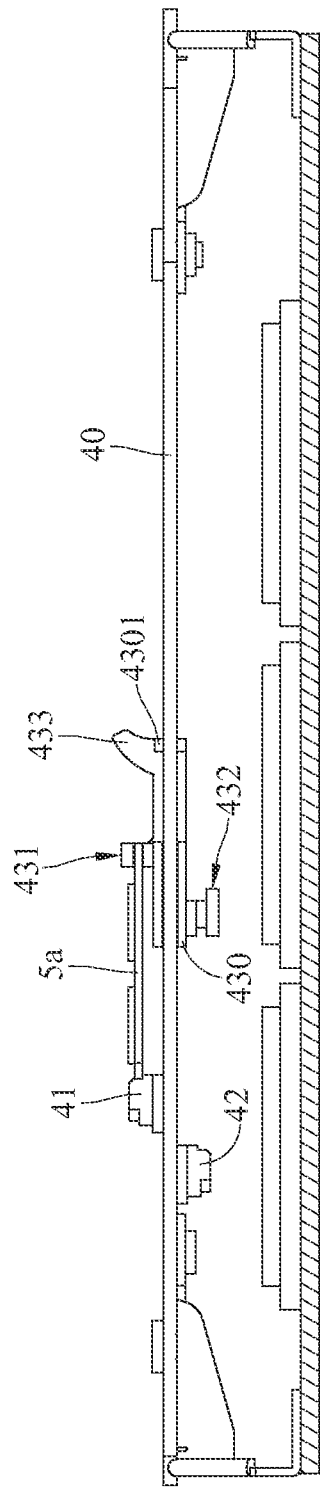
FIG. 8 is a side view of an electronic device with an interface card fastened to a fastening module according to a second embodiment.
Figure 9:
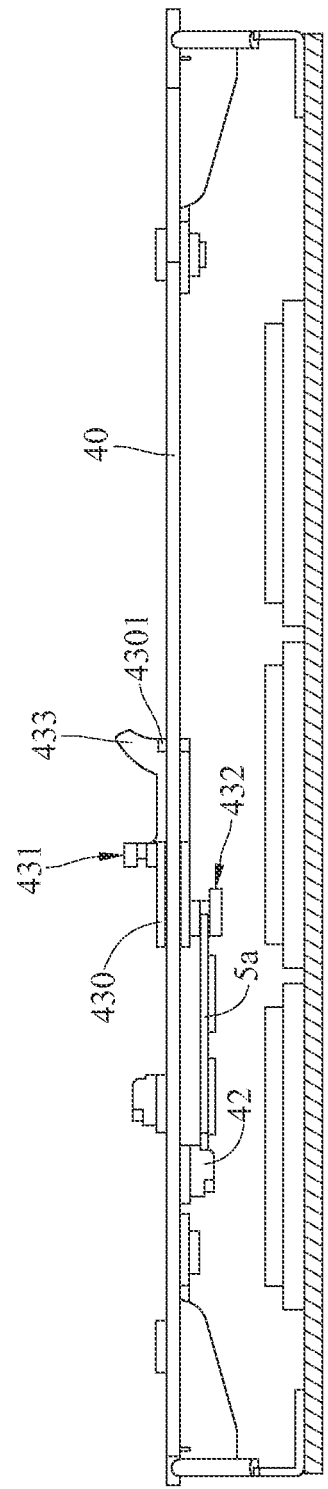
FIG. 9 is a side view of the electronic device with the interface card fastened to the other position of the fastening module according to the second embodiment.

In the first embodiment, two interface cards are fastened to the fastening module simultaneously, but the disclosure is not limited thereto. Please refer to FIG. 8 and FIG. 9. FIG. 8 is a side view of an electronic device with an interface card fastened to a fastening module according to a second embodiment. FIG. 9 is a side view of the electronic device with the interface card fastened to the other position of the fastening module according to the second embodiment.

In this embodiment, only one interface card 5a is fastened to the fastening module 4. As seen in FIG. 8, the interface card 5a can be interposed between the first connector 41 and the first fastening portion 431, but the disclosure is not limited thereto. As seen in FIG. 9, in this embodiment, the interface card 5a can be interposed between the second connector 42 and the second fastening portion 432. In short, the interface card 5a is selectively interposed between the first connector 41 and the first fastening portion 431, or interposed between the second connector 42 and the second fastening portion 432.

According to the disclosure, the sliding portion of the fastening component is slidably disposed in the sliding groove for sliding relative to the circuit board so as to adjust the distance between the first fastening portion and the first connector and the distance between the second fastening portion and the second connector. It is convenient to fasten and replace the interface cards with different lengths by adjusting a position of the sliding portion in the sliding groove, thereby it is favorable for disposing more interface cards in the limited space of the electronic device E.

What is claimed is:

1. An electronic device, comprising:
   a case;
   a mother board disposed on the case;
   at least one fixing component fixed to the mother board;
   a fastening module, comprising:
   a circuit board electrically connected to the mother board, the circuit board and the mother board being fixed to the both ends of the fixing component respectively, the circuit board having a sliding groove, a top surface and a bottom surface, the top surface and the bottom surface being opposite to each other, and the sliding groove extending through the top surface and the bottom surface of the circuit board;
   a first connector fixed to the top surface of the circuit board;
   a second connector fixed to the bottom surface of the circuit board; and
   a fastening component comprising a sliding portion, a first fastening portion and a second fastening portion, the first fastening portion and the second fastening portion being fixed to the both sides of the sliding portion, respectively, and the first fastening portion corresponding to the first connector, the second fastening portion corresponding to the second connector, the sliding portion being slidably disposed in the sliding groove so as to adjust a distance between the first fastening portion and the first connector and a distance between the second fastening portion and the second connector; and
   at least one interface card having a first end and a second end that are opposite to each other, the first end of the interface card being selectively inserted into the first connector or the second connector so as to be electrically connected to the circuit board, and the second end of the interface card being selectively fastened to the first fastening portion or the second fastening portion so that the interface card is interposed between the first connector and the first fastening portion or between the second connector and the second fastening portion.

2. The electronic device according to claim 1, wherein the circuit board of the fastening module is located above the mother board, a gap is formed between the circuit board and the mother board, and the gap is greater than or equal to a thickness of the at least one interface card.

3. The electronic device according to claim 1, wherein the mother board comprises a slot, and the fastening module is fixed to the mother board via the fixing component so as to cover the slot.

4. The electronic device according to claim 1, further comprising at least one electrical insulator interposed between the fixing component and the circuit board of the fastening module so as to connect the fixing component to the circuit board.

5. The electronic device according to claim 1, wherein both of the first connector and the second connector are electrically connected to the circuit board, a first projecting zone is defined by orthogonally projecting the first connector on the top surface of the circuit board, a second projecting zone is defined by orthogonally projecting the second connector on the bottom surface of the circuit board, and the first projecting zone is not overlapped with the second projecting zone.

6. The electronic device according to claim 1, wherein the number of the interface card is two, each of the interface card has an indentation located at the second end, each of the first fastening portion and the second fastening portion has two protrusions separated by a distance, the indentation is interposed between the two protrusions so that the two interface cards are fastened to the first fastening portion and the second fastening portion, respectively.

7. The electronic device according to claim 1, wherein the sliding portion comprises an extending part along an edge of the sliding groove, and the extending part has a limiting block, the sliding groove of the circuit board has a first limiting notch and a second limiting notch which both match the limiting block, the limiting block is fastened to the first limiting notch or the second limiting notch so that the sliding portion is fixed to the circuit board.

8. The electronic device according to claim 1, wherein the sliding groove of the circuit board has a first side edge and a second side edge that are opposite to each other, the sliding portion comprises two extending parts extending along the first side edge and the second side edge, respectively, each of the two extending parts has a limiting block, the sliding groove further has two first limiting notches and two second limiting notches which match to the two limiting blocks, the two first limiting notches are located at the first side edge and the second side edge, respectively, and the two first limiting notches face to each other, the two second limiting notches are located at the first side edge and the second side edge, respectively, and the two second limiting notches face to each other, the limiting block is fastened to the first limiting notch or the second limiting notch so that the sliding portion is fixed to the circuit board.

9. The electronic device according to claim 8, wherein the fastening component further comprises two pressing portions that are fixed on the two extending parts, respectively, when each of the two pressing portions is pressed by an external force, the two extending parts get closer to each other, the two limiting blocks are separated from the two first limiting notches or the two second limiting notches, respectively.

10. A fastening module for fastening at least one interface card, the interface card having a first end and a second end that are opposite to each other, the fastening module comprising: a circuit board having a sliding groove, a top surface and a bottom surface, the top surface and the bottom surface being opposite to each other, and the sliding groove extending through the top surface and the bottom surface; a first connector fixed to the top surface of the circuit board; a second connector fixed to the bottom surface of the circuit board; and a fastening component comprising a sliding portion, a first fastening portion and a second fastening portion, the first fastening portion and the second fastening portion being fixed to the both sides of the sliding portion respectively, and the first fastening portion corresponding to the first connector, the second fastening portion corresponding to the second connector, the sliding portion being slidably disposed in the sliding groove so as to adjust a distance between the first fastening portion and the first connector and a distance between the second fastening portion and the second connector; wherein the first end of the at least one interface card is selectively inserted into the first connector or the second connector, and the second end is selectively fastened to the first fastening portion or the second fastening portion so that the at least one interface card is interposed between the first connector and the first fastening portion or between the second connector and the second fastening portion.

11. The fastening module according to claim 10, wherein the sliding groove of the circuit board has a first side edge and a second side edge that are opposite to each other, the sliding portion comprises two extending parts extending along the first side edge and the second side edge to form two extending parts, respectively, each of the two extending parts has a limiting block, the sliding groove further has two first limiting notches and two second limiting notches which match to the two limiting blocks, the two first limiting notches are located at the first side edge and the second side edge, respectively, and the two first limiting notches face to each other, the two second limiting notches are located at the first side edge and the second side edge, respectively, the two second limiting notches face to each other, the limiting block is fastened to the first limiting notch or the second limiting notch so that the sliding portion is fixed to the circuit board.

12. The fastening module according to claim 11, wherein the fastening component further comprises two pressing portions that are fixed on the two extending parts, respectively, when each of the two pressing portions is pressed by an external force, the two extending parts get closer to each other, the two limiting blocks are separated from the two first limiting notches or the two second limiting notches, respectively.

* * * * *